United States Patent
Cosentino et al.

(10) Patent No.: US 11,861,292 B2
(45) Date of Patent: Jan. 2, 2024

(54) MULTI-STRATEGY COMPRESSION SCHEME

(71) Applicant: Red Hat, Inc., Raleigh, NC (US)

(72) Inventors: Andrea Cosentino, Milan (IT); Paolo Antinori, Milan (IT)

(73) Assignee: Red Hat, Inc., Raleigh, NC (US)

( * ) Notice: Subject to any disclaimer, the term of this patent is extended or adjusted under 35 U.S.C. 154(b) by 28 days.

(21) Appl. No.: 17/231,766

(22) Filed: Apr. 15, 2021

(65) Prior Publication Data
US 2022/0335208 A1  Oct. 20, 2022

(51) Int. Cl.
| | | |
|---|---|---|
| *G06F 40/12* | (2020.01) | |
| *G06F 40/205* | (2020.01) | |
| *G06F 40/242* | (2020.01) | |
| *H03M 7/30* | (2006.01) | |
| *H03M 7/40* | (2006.01) | |

(52) U.S. Cl.
CPC ............ *G06F 40/12* (2020.01); *G06F 40/205* (2020.01); *G06F 40/242* (2020.01); *H03M 7/40* (2013.01); *H03M 7/607* (2013.01)

(58) Field of Classification Search
CPC ...... G06F 40/12; G06F 40/205; G06F 40/242; H03M 7/40; H03M 7/607; H03M 7/3088; H03M 7/60; H03M 7/6082; H03M 7/6094; H03M 7/70; H03M 7/707
See application file for complete search history.

(56) References Cited

U.S. PATENT DOCUMENTS

| | | | |
|---|---|---|---|
| 6,696,992 B1 * | 2/2004 | Chu | H03M 7/40 |
| | | | 341/67 |
| 7,561,745 B2 * | 7/2009 | Jang | H03M 7/3079 |
| | | | 345/473 |
| 9,171,008 B2 | 10/2015 | Prahlad et al. | |
| 9,448,812 B2 | 9/2016 | Claussen et al. | |
| 9,727,572 B2 | 8/2017 | Dani | |
| 9,990,389 B1 * | 6/2018 | Zenger | G06F 16/24568 |
| 10,491,240 B1 * | 11/2019 | Dupont | H03M 7/3088 |
| 10,812,355 B2 | 10/2020 | Pilkington | |
| 11,138,175 B2 * | 10/2021 | Arye | G06F 16/113 |
| 11,630,812 B2 * | 4/2023 | Thöemmes | G06F 16/958 |
| | | | 707/769 |

(Continued)

OTHER PUBLICATIONS

Shanmugasundaram et al. A Comparative Study of Text Compression Algorithms. International Journal of Wisdom Based Computing, vol. 1 (3), Dec. 2011. pp 68-76. Retrieved via ResearchGate from [https://www.researchgate.net/publication/265661965] on [Jun. 28, 2022]. (Year: 2011).*

(Continued)

*Primary Examiner* — Tadesse Hailu
(74) *Attorney, Agent, or Firm* — K&L Gates LLP (57) ABSTRACT

A system includes a memory and a processor, where the processor is in communication with the memory. The processor is configured to receive a request to compress a schema. The schema is analyzed to determine whether to apply a first type of compression or a second type of compression, where analyzing the schema includes determining whether the schema exceeds a threshold level. Upon determining that the schema exceed the threshold level, a compressed schema is generated by performing the second type of compression. Next, the processor responds to the request with the compressed schema.

17 Claims, 4 Drawing Sheets

(56) References Cited

U.S. PATENT DOCUMENTS

| | | | | |
|---|---|---|---|---|
| 2008/0071724 | A1* | 3/2008 | Parkinson | G06F 16/258 |
| 2010/0250610 | A1* | 9/2010 | Kanawa | G06F 16/93 |
| | | | | 707/E17.044 |
| 2012/0135723 | A1* | 5/2012 | Ramo | G06F 16/9535 |
| | | | | 455/418 |
| 2014/0351229 | A1* | 11/2014 | Gupta | H03M 7/3073 |
| | | | | 707/693 |
| 2016/0219089 | A1 | 7/2016 | Murthy et al. | |
| 2017/0141791 | A1* | 5/2017 | Balegar | H03M 7/3079 |
| 2018/0075107 | A1* | 3/2018 | Park | G06F 16/248 |

OTHER PUBLICATIONS

Halder-Iverson, Sondre. Improving the text compression ratio for ASCII text: Using a combination of dictionary coding, ASCII compression, and Huffman coding. The Arctic University of Norway. INF-3990 Master's thesis in Computer Science—Nov. 2020. 56 pages. (Year: 2020).*

Fang et al. A Compressed XML Schema Representation for Metadata Processing in Mobile Environments. 0-7803-9752-5/06/ $20.00 © 2006 IEEE. pp. 493-496. (Year: 2006).*

Maarek, Stephane. Introduction to Schemas in Apache Kafka with the Confluent Schema Registry. Blog post at Medium.com posted on Dec. 12, 2017. Retrieved from [https://medium.com/@stephane.maarek/introduction-to-schemas-in-apache-kafka-with-the-confluent-schema-registry-3bf55e401321] on [Jun. 28, 2022]. 15 p (Year: 2017).*

Mousavi, Seyed Morteza. Exploit Apache Kafka's Message Format to Save Storage and Bandwidth. Blog entry at Medium.com posted on Oct. 3, 2019. Retrieved from [https://medium.com/swlh/exploit-apache-kafkas-message-format-to-save-storage-and-bandwidth-7e0c533edf26] on [Jun. 28, 2022]. 13 pages (Year: 2019).*

Natchetoi et al. A Context-Dependent XML Compression Approach to Enable Business Applications on Mobile Devices. A.-M. Kermarrec, L. Bouge, and T. Priol (Eds.): Euro-Par 2007, LNCS 4641, pp. 911-920. © Springer-Verlag Berlin Heidelberg 2007. (Year: 2007).*

Jean-Paul Azar, "Kafka Detailed Design and Ecosystem", Big Data Zone Tutorial, Aug. 29, 2017; https://dzone.com/articles/kafka-detailed-design-and-ecosystem; Aug. 29, 2017; 14 pages.

Seyed Morteza Mousavi, "Exploit Apache Kafka's Message Format to Save Storage and Bandwidth", https://medium.com/swlh/exploit-apache-kafkas-message-format-to-save-storage-and-bandwidth-7e0c533edf26; Oct. 3, 2019, 12 pages.

* cited by examiner

MULTI-STRATEGY COMPRESSION SCHEME

BACKGROUND

Computer systems may run applications or services that are provided via a server or cloud. The applications or services can be developed and deployed at runtime. Application instances or services may run within containers, which may be run on physical or virtual machines. The containers may be used to separate various components of a computing system. For example, different components of a computing system may be executed at different containers and/or virtual machines executing on a computing device or multiple computing devices. Maintenance and/or modifications to installed service and/or applications may often be applied in various server or cloud environments which may be continuously evolving.

SUMMARY

The present disclosure provides new and innovative systems and methods for implementing an optimized compression technique based on data being transmitted. In an example, a method includes receiving a request to compress a schema. Next, the method includes analyzing the schema to determine whether to apply a first type of compression or a second type of compression, where analyzing the schema includes determining whether the schema exceeds a threshold level. Upon determining that the schema exceeds the threshold level, a compressed schema is generated by performing the second type of compression. Next, the method includes responding to the request with the compressed schema.

In an example, a system includes a memory and a processor, where the processor is in communication with the memory. The processor is configured to receive a request to compress a schema. The schema is analyzed to determine whether to apply a first type of compression or a second type of compression, where analyzing the schema includes determining whether the schema exceeds a threshold level. Upon determining that the schema exceed the threshold level, a compressed schema is generated by performing the second type of compression. Next, the processor responds to the request with the compressed schema.

In an example, a non-transitory machine readable medium stores code, which when executed by a processor is configured to receive a request to compress a schema. The schema is analyzed to determine whether to apply a first type of compression or a second type of compression, where analyzing the schema includes determining whether the schema exceeds a threshold level. Upon determining that the schema exceeds the threshold level, a compressed schema is generated by performing the second type of compression. Next, the processor is configured to respond to the request with the compressed schema.

Additional features and advantages of the disclosed method and apparatus are described in, and will be apparent from, the following Detailed Description and the Figures. The features and advantages described herein are not all-inclusive and, in particular, many additional features and advantages will be apparent to one of ordinary skill in the art in view of the figures and description. Moreover, it should be noted that the language used in the specification has been principally selected for readability and instructional purposes, and not to limit the scope of the inventive subject matter.

DETAILED DESCRIPTION

Techniques are disclosed for providing an ability to selectively apply data compression based on contents of a schema. Typically, an application implementing an interface for streaming and/or sending data (e.g., an interface associated with a kafka topic) requires a schema or a reference to the schema that defines the variable interface. Conventionally, a schema provides a definition of a format of data being written and/or sent via the interface. Often, depending on a complexity of data structures within a schema, the schema can be very large. Generally, a schema is published to a schema registry or sent together with a message (e.g., a record), which can add a significant amount of overhead to transmission of the message (e.g., a record). Typically, extra overhead associated with sending a schema causes a system to waste bandwidth, time, and processing power sending the schema.

As described in various examples disclosed herein, to facilitate reducing an amount of system resources required for transmitting a schema, the systems and methods disclosed herein advantageously applies an adaptive compression technique tailored to contents of the schema. In various implementations, an adaptive compression technique may apply one or more text compression algorithms (e.g., a short text compression algorithm or a pure text compression algorithm) to decrease a dimension of the overall schema and reduce an amount of network traffic and time required to complete the operation.

For example, when an application attempts to output or write data (e.g., writing data to a kafka topic), a schema may be required to interpret the data being output. In most instances, a schema describes structures and/or format of data being output. In various implementations, a schema may be published to a schema registry or may be sent together with a message (e.g., a record). Prior to publishing or sending a schema, an application may apply a string compression algorithm (e.g., shoco compression algorithm, Huffman text compression algorithm, SMAZ compression algorithm, and/or other compression algorithms), selected based on contents of the schema, to the schema. In many implementations, compression algorithms applied may be able to reduce a size of a schema by up to 50%.

Figure 1:
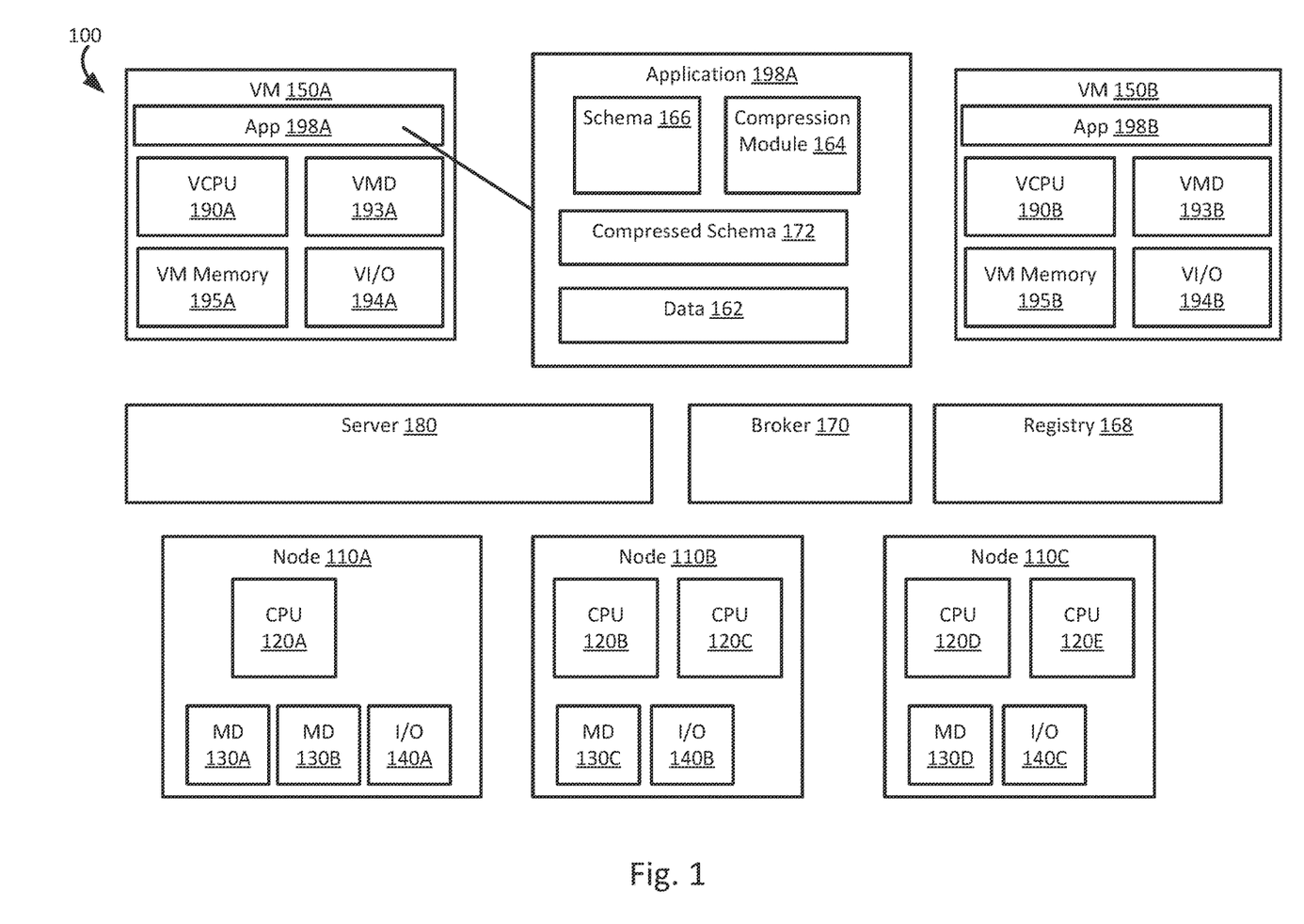
FIG. 1 illustrates a high level component diagram of an example computing system in accordance with one or more aspects of the present disclosure.

FIG. 1 depicts a high-level component diagram of an example computing system 100 in accordance with one or more aspects of the present disclosure. The computing system 100 may include a server 180, broker 170, registry 168, one or more virtual machines (VM 150A-B, 150 generally), and nodes (e.g., nodes 110A-C, 110 generally). In various implementations, an application (e.g., application 198A) may stream and/or communicate data directly with other applications (e.g., application 198B). In these implementations, an application (e.g., application 198A) may send a schema (e.g., schema 166) with streamed and/or communicated data (e.g., data 162). In certain implementations, an application (e.g., application 198A) may stream and/or communicate data with other applications via a broker (e.g., broker 170). In these instances, an application (e.g., application 198A) may register a schema (e.g., schema 166) at a registry (e.g., registery 168). In various implementations, an application (e.g., application 198B) may retrieve a schema (e.g. schema 166) from a registry (e.g., registry 168) to decode data (e.g., data 162) streamed by another application (e.g., application 198A). In this implementation, an application (e.g., application 198B) may subscribe to the data (e.g., data 162) via a broker (e.g., broker 170), where the broker may forward and/or stream the data to the application. In certain implementations, schemas (e.g. schema 166) may be stored as a compressed schema (e.g., compressed schema 172) to reduce an amount of bandwidth taken up when transmitting and/or retrieving a schema.

Virtual machines 150A-B may include a virtual machine memory (VM Memory), a virtual CPU (VCPU), virtual memory devices (VMD), and virtual input/output devices (VI/O). For example, virtual machine 150A may include virtual machine memory 195A, a virtual CPU 190A, a virtual memory devices 193A, and a virtual input/output device 194A. Similarly, virtual machine 150B may include virtual machine memory 195B, a virtual CPU 190B, a virtual memory devices 193B, and virtual input/output device 194B. In an example, Applications 198A-B may be different applications or services. In another example, applications 198A-B may be different instances of the same application or service.

In an example, a virtual machine 150A may execute a guest operating system and run applications 198A-B which may utilize the underlying VCPU 190A, VMD 193A, and VI/O device 194A. One or more applications 198A-B may be running on a virtual machine 150A under the respective guest operating system. A virtual machine (e.g., VM 150A-B, as illustrated in FIG. 1) may run on any type of dependent, independent, compatible, and/or incompatible applications on the underlying hardware and operating system ("OS"). In an example, applications (e.g., App 198A-B) run on a virtual machine 150A may be dependent on the underlying hardware and/or OS. In another example embodiment, applications 198A-B run on a virtual machine 150A may be independent of the underlying hardware and/or OS. For example, application 198A run on a first virtual machine 150A may be dependent on the underlying hardware and/or OS while application (e.g., application 198B) run on a second virtual machine (e.g., VM 150B) is independent of the underlying hardware and/or OS. Additionally, applications 198A-B run on a virtual machine 150A may be compatible with the underlying hardware and/or OS. In an example embodiment, applications 198A-B run on a virtual machine 150A may be incompatible with the underlying hardware and/or OS. For example, application 198A run on one virtual machine 150A may be compatible with the underlying hardware and/or OS while applications 198B run on another virtual machine 150B are incompatible with the underlying hardware and/or OS.

In an example, virtual machines 150A-B may instead be containers that execute applications or services, such as microservices. In an example, the containers may each run a process or service and the containers may be any execution environment. For example, the containers may be a virtual server. It should be appreciated that containers may be stand alone execution environments, similar to that of a virtual machine. The applications 198A-B or services (e.g., microservices) may run in a software container or a virtual machine (e.g., virtual machines 150A-B).

The computer system 100 may include one or more nodes 110A-C. Each node 110A-C may in turn include one or more physical processors (e.g., CPU 120A-E) communicatively coupled to memory devices (e.g., MD 130A-D) and input/output devices (e.g., I/O 140A-C). Each node 110A-C may be a computer, such as a physical machine and may include a device, such as hardware device. In an example, a hardware device may include a network device (e.g., a network adapter or any other component that connects a computer to a computer network), a peripheral component interconnect (PCI) device, storage devices, disk drives, sound or video adaptors, photo/video cameras, printer devices, keyboards, displays, etc. Virtual machines 150A-B may be provisioned on the same host or node (e.g., node 110A) or different nodes. For example, VM 150A and VM 150B may both be provisioned on node 110A. Alternatively, VM 150A may be provided on node 110A while VM 150B is provisioned on node 110B.

As used herein, physical processor or processor 120A-E refers to a device capable of executing instructions encoding arithmetic, logical, and/or I/O operations. In one illustrative example, a processor may follow Von Neumann architectural model and may include an arithmetic logic unit (ALU), a control unit, and a plurality of registers. In a further aspect, a processor may be a single core processor which is typically capable of executing one instruction at a time (or process a single pipeline of instructions), or a multi-core processor which may simultaneously execute multiple instructions. In another aspect, a processor may be implemented as a single integrated circuit, two or more integrated circuits, or may be a component of a multi-chip module (e.g., in which individual microprocessor dies are included in a single integrated circuit package and hence share a single socket). A processor may also be referred to as a central processing unit (CPU).

As discussed herein, a memory device 130A-D refers to a volatile or non-volatile memory device, such as RAM, ROM, EEPROM, or any other device capable of storing data. As discussed herein, I/O device 140A-C refers to a device capable of providing an interface between one or more processor pins and an external device capable of inputting and/or outputting binary data.

Processors (e.g., CPUs 120A-E) may be interconnected using a variety of techniques, ranging from a point-to-point processor interconnect, to a system area network, such as an Ethernet-based network. Local connections within each node, including the connections between a processor 120A-E and a memory device 130A-D may be provided by one or more local buses of suitable architecture, for example, peripheral component interconnect (PCI).

Figure 2:
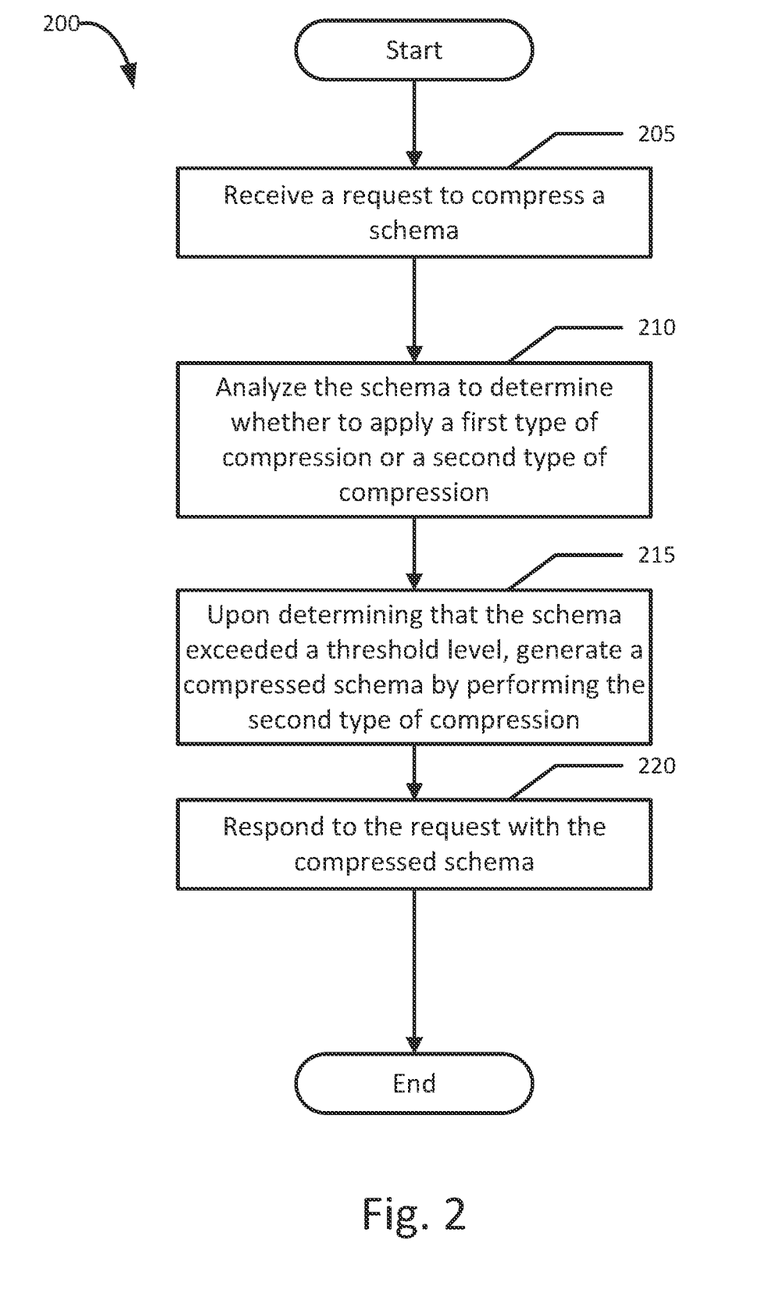
FIG. 2 illustrates a flowchart of an example method of selectively compressing a model in accordance with one or more aspects of the present disclosure.

FIG. 2 illustrates a flowchart of an example method of selectively compressing a model, in accordance with an embodiment of the present disclosure. Although the example method 200 is described with reference to the flowchart illustrated in FIG. 2, it will be appreciated that many other methods of performing the acts associated with the method 200 may be used. For example, the order of some of the blocks may be changed, certain blocks may be combined with other blocks, blocks may be repeated and some of the blocks described are optional. The method 200 may be performed by processing logic that may comprise hardware (circuitry, dedicated logic, etc.), software, or a combination of both.

As shown in FIG. 2, an example method 200 may begin with receiving a request to compress a schema (block 205). In various implementations, an application (e.g., application 198A) may request that a compression module (e.g., a compression module 164) compress a schema (e.g., schema 166). For example, application 198A may be streaming data 162 (e.g., a movie) directly to application 198B. In this instance, the application 198A may request that compression module 164 compress schema 166 prior to sending the schema 166 with data 162 to application 198B. Next, the example method 200 may include analyzing the schema to determine whether to apply a first type of compression or a second type of compression (block 210). In this instance, analyzing the schema includes determining whether the schema exceeds a threshold level. For example, in one implementation, compression module 164 may analyze the schema 166 to determine whether to apply short text string compression or text compression. In this implementation, compression module 164 may parse the schema 166 into words and may determine whether an average length of the words is less than or equal to a threshold level. In other implementations, compression module 164 may determine a size of the schema 166 and may determine whether the size of the schema 166 is less than or equal to the threshold level. In yet another implementation, compression module 164 may parse the schema into words and may determine a percentage of words included in a curated dictionary is less than or equal to the threshold level. In various implementations, different types of compression may be used.

Next, the example method 200 may include upon determining that the schema exceeded a threshold level, generate a compressed schema by performing the second type of compression (block 215). For example, in one implementation, upon determining that the schema 166 exceeded a threshold level, the compression module 164 may generate a compressed schema 172 by performing the second type of compression (e.g., text compression). In another implementation, upon determining that the schema 166 does not exceed a threshold level, the compression module 164 may generate a compressed schema 172 by performing the first type of compression (e.g., short text string compression). Next, the example method 200 may include responding to the request with the compressed module (block 220). For example, in one implementation, the compression module 164 responds to the request with the compressed schema 172.

Figure 3:
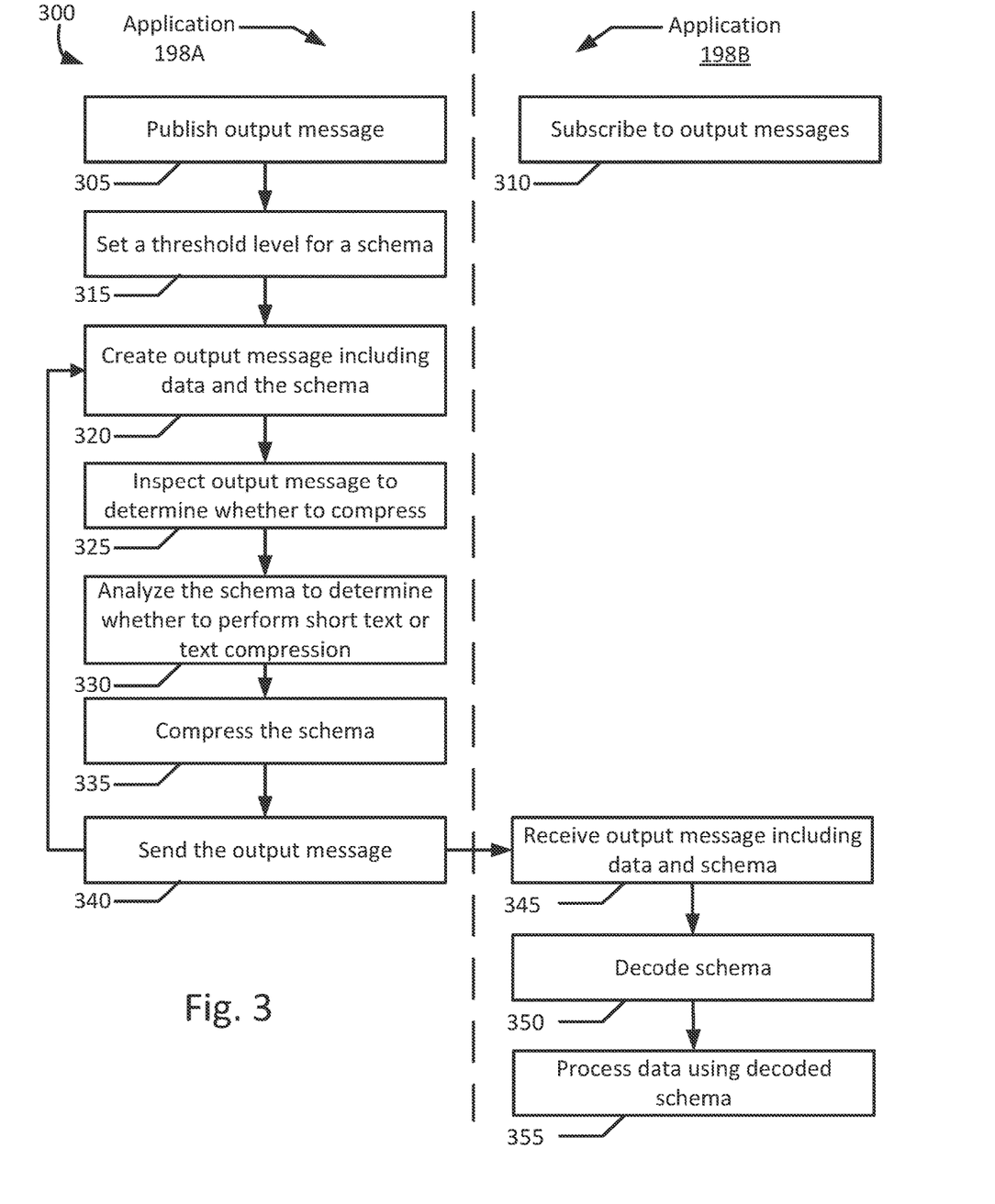
FIG. 3 illustrates a flow diagram of an example methods of streaming data to an application according to an example embodiment of the present disclosure.

FIG. 3 illustrates a flow diagram of an example methods of streaming data to an application, in accordance with an embodiment of the present disclosure. Although the example method 300 is described with reference to the flow diagram illustrated in FIG. 3, it will be appreciated that many other methods of performing the acts associated with the method 300 may be used. For example, the order of some of the blocks may be changed, certain blocks may be combined with other blocks, blocks may be repeated, and some of the blocks described are optional. For example, in the illustrated flow diagram, an application 198A executing on virtual machine 150A may use a compression module 164 to compress a schema used to stream data to an application 198B on a virtual machine 150B.

As shown in FIG. 3, application 198A initializes and publishes an output message (block 305). Similarly, upon execution, application 198B subscribes to the output message (block 310). For example, an application (e.g., application 198B) may subscribe to a stream of financial information or a video stream. Next, application 198A sets a threshold level (e.g., a threshold level may be set for 60%) for schemas (e.g., schema 166) defining data (e.g., data 162) streamed from application 198A (block 315). Application 198A creates an output message including data 162 and schema 166 (block 320). For example, in some instances, an application may subscribe directly to a producer of content (e.g., streaming video, financial data, daily news). In these instances, a producer of content may include a schema associated with their data with every message (e.g., a record) sent form the producer. Subsequently, compression module 164 inspects the output message to determine whether to compress the output message (block 325).

The compression module 164 analyzes the schema 166 to determine whether to perform short text compression or text compression (block 330) and then compresses the schema 166 to generate compressed schema 172 (block 335). For example, a compression module may parse a schema and calculate an average length of words in the schema. In this instance, if the average length is less than or equal to a threshold length, then a short text string compression algorithm is used. Otherwise, a text compression algorithm may be used. In an alternate example, a compression module may parse a schema and have a threshold level equal to a maximum percentage of words from a curated dictionary that may be in the schema. In this example, if the percentage of words from the curated dictionary is greater than or equal to a threshold level, a short text string compression algorithm may be used, otherwise a text compression algorithm may be used. In some instances, a compression module may select a compression algorithm based on a size of a schema. If a schema exceeds a threshold level, a text string compression algorithm may be used, otherwise a text compression may be used. In most implementations, an ability to modify a compression algorithm may provide significant bandwidth savings when transmitting schemas to either another application or a registry. In certain instances, when an application streams directly to another application, bandwidth savings may be significant as a schema may be transmitted with each stream of data.

Next, application 198A sends the output message which includes data 162 and compressed schema 172 (block 340). Application 198B receives the output message including the data 162 and compressed schema 172 (block 345) and decodes the compressed schema 172 to retrieve the original schema 166 (block 350). In various implementations, a type of compression used within a schema may be stored in meta-data associated with the schema. In some implementations, a type of compression used within a schema may be included in a header of an output stream. Next, application 198B processes data 162 using decoded schema 166 (block 355).

Figure 4:
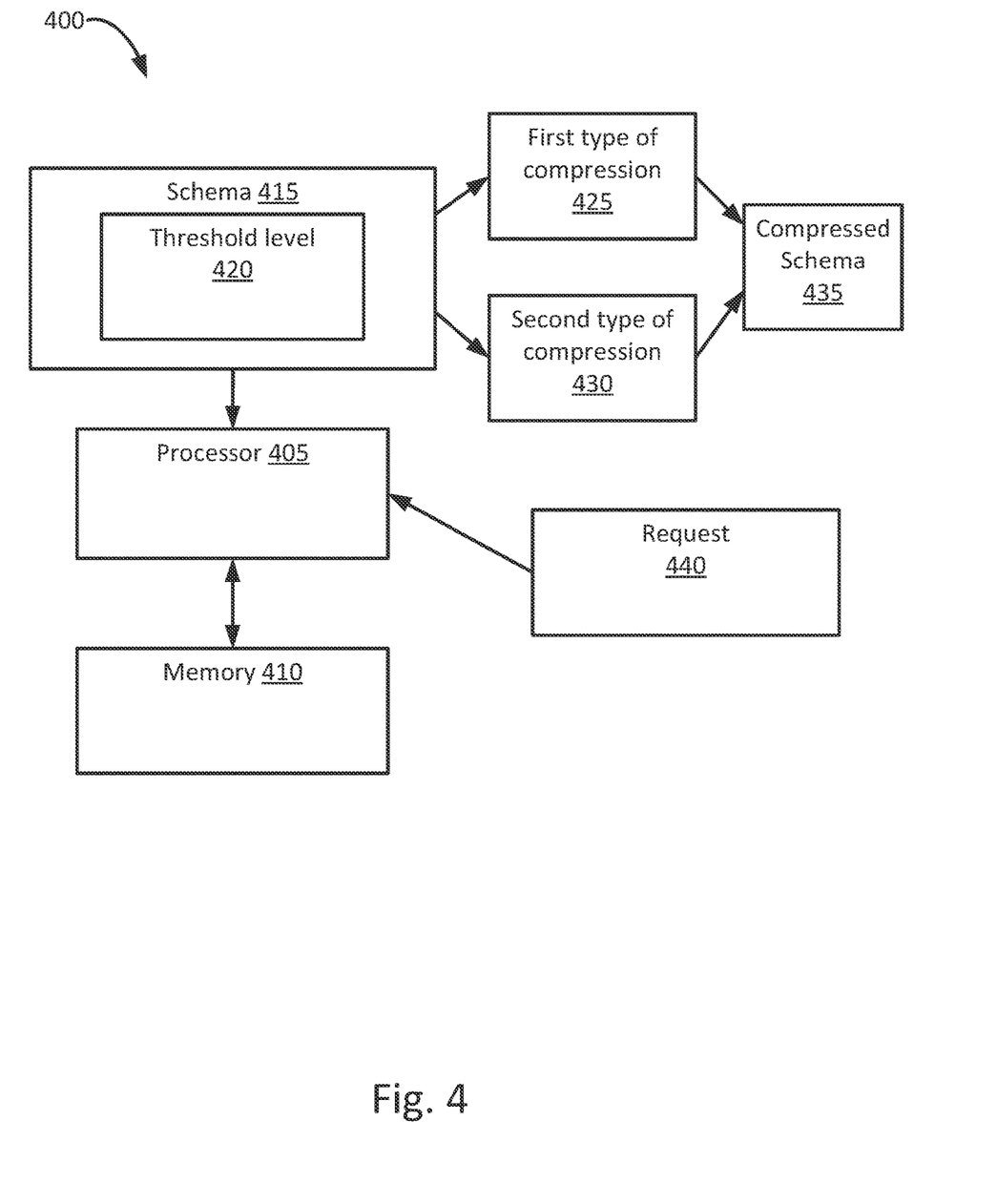
FIG. 4 illustrates a block diagram of an example system selectively compressing a model according to an example embodiment of the present disclosure.

FIG. 4 is a block diagram of system 400 which includes memory 410 and processor 405. The processor 405 is in communication with the memory 410. The processor is configured to receive a request 440 to compress a schema 415. The schema 415 is analyzed to determine whether to apply a first type of compression 425 or a second type of compression 430, where analyzing the schema 415 includes determining whether the schema exceeds a threshold level 420. Upon determining that the schema 415 exceeds the threshold level 420, a compressed schema 435 is generated by performing the second type of compression. The compressed schema 435 is sent in response to the request 440.

It will be appreciated that all of the disclosed methods and procedures described herein can be implemented using one or more computer programs or components. These components may be provided as a series of computer instructions on any conventional computer readable medium or machine readable medium, including volatile or non-volatile memory, such as RAM, ROM, flash memory, magnetic or optical disks, optical memory, or other storage media. The instructions may be provided as software or firmware, and/or may be implemented in whole or in part in hardware components such as ASICs, FPGAs, DSPs or any other similar devices. The instructions may be configured to be executed by one or more processors, which when executing the series of computer instructions, performs or facilitates the performance of all or part of the disclosed methods and procedures.

It should be understood that various changes and modifications to the example embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed is:

1. A system, comprising:
   a memory; and
   a processor in communication with the memory, wherein the processor is configured to:
   create an output message associated with an application, wherein the output message comprises data and a schema having contents;
   setting a threshold level for schemas related to the application;
   inspect the output message to determine whether to compress the output message;
   analyze the schema to determine whether to apply a first type of compression or a second type of compression, wherein analyzing the schema includes determining based on the contents of the schema whether the schema exceeds the threshold level;
   upon determining that the schema exceeds the threshold level, generate a compressed schema by performing the second type of compression;
   upon determining that the schema is within the threshold level, generate the compressed schema by performing the first type of compression; and
   send the output message comprising the data and the compressed schema.

2. The system of claim 1, wherein the first type of compression is short text string compression and the second type of compression is text compression.

3. The system of claim 1, wherein analyzing the schema comprises:
   parsing the schema into words; and
   determining whether an average length of the words is less than or equal to the threshold level.

4. The system of claim 1, wherein analyzing the schema comprises:
   determining a size of the schema; and
   determining whether the size of the schema is less than or equal to the threshold level.

5. The system of claim 1, wherein analyzing the schema comprises:
   parsing the schema into words; and
   determining a percentage of the words included in a curated dictionary is less than or equal to the threshold level.

6. A method, comprising:
   creating an output message associated with an application, wherein the output message comprises data and a schema having contents;
   setting a threshold level for schemas related to the application;
   inspecting the output message to determine whether to compress the output message;
   analyzing the schema to determine whether to apply a first type of compression or a second type of compression, wherein analyzing the schema includes determining based on the contents of the schema whether the schema exceeds the threshold level;
   upon determining that the schema exceed the threshold level, generating a compressed schema by performing the second type of compression;
   upon determining that the schema is within the threshold level, generating the compressed schema by performing the first type of compression; and
   sending the output message comprising the data and the compressed schema.

7. The method of claim 6, wherein the first type of compression is short text string compression and the second type of compression is text compression.

8. The method of claim 6, wherein the second type of compression is a Huffman coding compression algorithm.

9. The method of claim 6, wherein the first type of compression is a shoco compression algorithm.

10. The method of claim 6, wherein analyzing the schema comprises:
    parsing the schema into words; and
    determining whether an average length of the words is less than or equal to the threshold level.

11. The method of claim 6, wherein analyzing the schema comprises:
    determining a size of the schema; and
    determining whether the size of the schema is less than or equal to the threshold level.

12. The method of claim 6, wherein analyzing the schema comprises:
    parsing the schema into words; and
    determining a percentage of the words included in a curated dictionary is less than or equal to the threshold level.

13. A non-transitory machine readable medium storing code, which when executed by a processor is configured to:
    create an output message associated with an application, wherein the output message comprises data and a schema having contents;
    set a threshold level for schemas related to the application;
    inspect the output message to determine whether to compress the output message;
    analyze the schema to determine whether to apply a first type of compression or a second type of compression, wherein analyzing the schema includes determining based on the contents of the schema whether the schema exceeds the threshold level;
    upon determining that the schema exceed the threshold level, generate a compressed schema by performing the second type of compression;
    upon determining that the schema is within the threshold level, generate the compressed schema by performing the first type of compression; and
    send the output message comprising the data and the compressed schema.

14. The non-transitory machine readable medium of claim 13, wherein the first type of compression is short text string compression and the second type of compression is text compression.

15. The non-transitory machine readable medium of claim 13, wherein analyzing the schema comprises:
parsing the schema into words; and
determining whether an average length of the words is less than or equal to the threshold level.

16. The non-transitory machine readable medium of claim 13, wherein analyzing the schema comprises:
determining a size of the schema; and
determining whether the size of the schema is less than or equal to the threshold level.

17. The non-transitory machine readable medium of claim 13, wherein analyzing the schema comprises:
parsing the schema into words; and
determining a percentage of the words included in a curated dictionary is less than or equal to the threshold level.

\* \* \* \* \*